(12) United States Patent
Biber et al.

(10) Patent No.: US 11,611,346 B2
(45) Date of Patent: Mar. 21, 2023

(54) DEVICE, SYSTEM, AND METHOD TO REGULATE TEMPERATURE OF A RESONATOR STRUCTURE

(71) Applicant: Intel Corporation, Santa Clara, CA (US)

(72) Inventors: Catharina Biber, Portland, OR (US); Jason Mix, Portland, OR (US); Mark Carbone, Cupertino, CA (US); Mohamed A. Abdelmoneum, Portland, OR (US); Joshua Linden Levy, Portland, OR (US); Timo Huusari, Hillsboro, OR (US); Sarah Shahraini, Oviedo, FL (US)

(73) Assignee: Intel Corporation, Santa Clara, CA (US)

( * ) Notice: Subject to any disclaimer, the term of this patent is extended or adjusted under 35 U.S.C. 154(b) by 760 days.

(21) Appl. No.: 16/449,107

(22) Filed: Jun. 21, 2019

(65) Prior Publication Data
US 2020/0403619 A1 Dec. 24, 2020

(51) Int. Cl.
*H03L 1/04* (2006.01)
*H01L 25/16* (2023.01)
*H03B 5/30* (2006.01)

(52) U.S. Cl.
CPC ............... *H03L 1/04* (2013.01); *H01L 25/16* (2013.01); *H03B 5/30* (2013.01)

(58) Field of Classification Search
CPC ........................................................ H03L 1/04
USPC ........................................................ 331/70
See application file for complete search history.

(56) References Cited

U.S. PATENT DOCUMENTS

| | | | |
|---|---|---|---|
| 5,921,087 A | | 7/1999 | Bhatia et al. |
| 6,094,919 A | * | 8/2000 | Bhatia ................... H01L 23/38 62/3.2 |
| 8,821,009 B2 | | 9/2014 | Abdelmoneum et al. |
| 8,827,550 B2 | | 9/2014 | Abdelmoneum et al. |
| 8,856,569 B2 | | 10/2014 | Monferrer et al. |

(Continued)

OTHER PUBLICATIONS

Analog Devices, "Thermoelectric Cooler (TEC) Controller", Data Sheet ADN8831; available online via: https://www.analog.com/media/en/technical-documentation/data-sheets/ADN8831.pdf; 2018.

(Continued)

*Primary Examiner* — Joseph Chang
(74) *Attorney, Agent, or Firm* — Essential Patents Group, LLP.

(57) ABSTRACT

Techniques and mechanisms for regulating a temperature of a resonator structure. In an embodiment, a thermoelectric cooler (TEC) is thermally coupled to a resonator which is proximate thereto. The resonator supports operation with an oscillator circuit, wherein a resonance characteristic of the resonator contributes to oscillations of a master clock signal, or other oscillatory signal, which is provided with the oscillator circuit. The TEC provides Peltier functionality to selectively perform either one of heating or cooling the resonator. In another embodiment, the TEC is configured to conduct heat which is transferred via a path between the TEC and the resonator, wherein the path omits any circuitry which is to perform operations which are synchronized based on the oscillatory signal.

17 Claims, 8 Drawing Sheets

(56) References Cited

U.S. PATENT DOCUMENTS 9,625,890 B2    4/2017  Carbone et al.
2011/0260800 A1* 10/2011 Shanfield .................. H03L 1/04
                                                    331/70

OTHER PUBLICATIONS

Maxim Integrated, "MAX1968/MAX1969 Power Drivers for Peltier TEC Modules", Datasheet; available online via: https://datasheets.maximintegrated.com/en/ds/MAX1968-MAX1969.pdf, 2015.

* cited by examiner

DEVICE, SYSTEM, AND METHOD TO REGULATE TEMPERATURE OF A RESONATOR STRUCTURE

BACKGROUND

1. Technical Field

This disclosure generally relates to temperature regulation techniques and more particularly, but not exclusively, to mitigation of frequency drift by a clock signal.

2. Background Art

Functionality of an integrated circuit typically relies on clear (low noise) and consistent clock signal that determines the timing of data processing, communications and/or other such operations. Conventional circuit clocking architectures variously attempt to protect the integrity of a clock signal by locating an oscillator circuit as close as possible to circuit resources which use the clock signal. Unfortunately, such oscillator circuits often rely on a resonator structure which is sensitive to variation in temperature.

To protect from such variation, conventional solutions usually use oven devices that keep resonator structures at relatively high, but consistent, temperatures. However, these oven devices require additional cost, impose a large power load, and do not allow for quick transitions to or from a high temperature. As successive generations of technologies continue impose increasingly strict power utilization requirements, there is expected to be an increasing premium placed on incremental improvements in power-efficient operation of integrated circuit devices.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
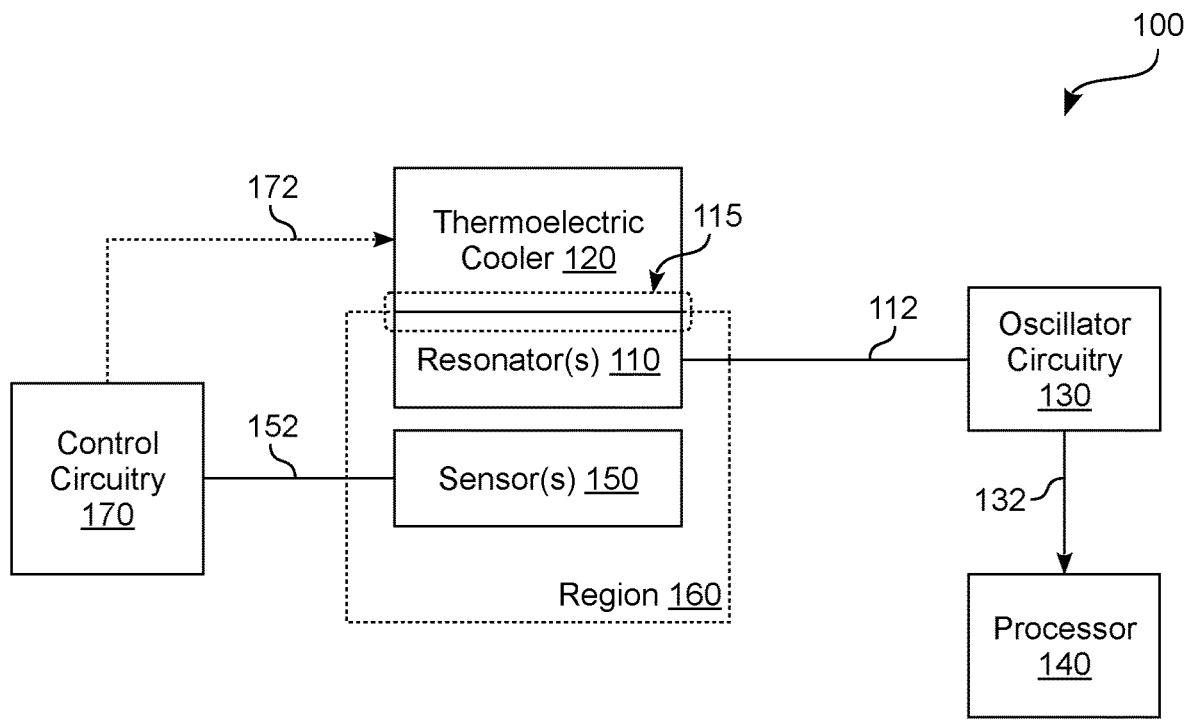
FIG. 1A is a functional block diagram illustrating elements of a system to regulate a temperature of a resonator according to an embodiment.

Embodiments described herein variously provide techniques and mechanisms for regulating a temperature of a resonator structure which, for example, is used in generating an oscillatory (e.g., periodic) signal. In an embodiment, a thermoelectric cooler (TEC) is thermally coupled to a resonator which is adjacent or otherwise proximate thereto—e.g., where a resonance characteristic of said resonator contributes to oscillations of the oscillatory signal. The TEC is operable to provide (for example) Peltier functionality that selectively performs either one of a heating or a cooling of the resonator. Such a TEC operates as a current-controlled bi-directional heat pump which, for example, provides either cooling or heating of an adjoining resonator based on a direction of flow for a direct current which is provided to the TEC.

In providing a TEC that is proximate to a resonator, some embodiments variously enable such a resonator to be maintained in a relatively low temperature range—e.g., as compared to temperature ranges provided by oven devices according to conventional techniques. Such embodiments provide a relatively power efficient solution—e.g., requiring less than 1 milliWatt (mW)—to stabilize temperature and/or frequency of a micromechanical (or other) resonator. For example, some embodiments variously enable a TEC to be turned off during a sleep mode of a processor and/or other circuit resources which operate based on the oscillatory signal. Alternatively or in addition, embodiments enable relatively fast temperature stabilization when transitioning such resources from a relatively low power (e.g., sleep) mode to a higher power mode. For example, some embodiments variously enable a target temperature for a resonator to be set lower than an expected maximum temperature of a CPU (or other such circuit resource). In one such embodiment, a target temperature for the resonator is at or below an average temperature of a processor (where, for example, the average is across different processor workloads)—e.g., where the resonator's temperature is maintained in a temperature range which includes temperatures below such an expected average processor temperature.

Certain features of various embodiments are described herein with reference to the temperature of a microelectromechanical system (MEMS) resonator being controlled by a TEC which is proximate thereto. However, such description can be extended to additionally or alternatively apply to temperature regulation for any of a variety of other types of resonator structures.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including a resonator structure that is to contribute to oscillations by a master clock signal or other such oscillatory signal.

In the following description, numerous details are discussed to provide a more thorough explanation of the embodiments of the present disclosure. It will be apparent to one skilled in the art, however, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate a greater number of constituent signal paths, and/or have arrows at one or more ends, to indicate a direction of information flow. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

It is to be understood that the terms so used are interchangeable under appropriate circumstances such that the embodiments of the invention described herein are, for example, capable of operation in other orientations than those illustrated or otherwise described herein.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. It is pointed out that those elements of a figure having the same reference numbers (or names) as the elements of any other figure can operate or function in any manner similar to that described, but are not limited to such.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

In addition, the various elements of combinatorial logic and sequential logic discussed in the present disclosure may pertain both to physical structures (such as AND gates, OR gates, or XOR gates), or to synthesized or otherwise optimized collections of devices implementing the logical structures that are Boolean equivalents of the logic under discussion.

For purposes of the embodiments, the transistors in various circuits, modules, and logic blocks are Tunneling FETs (TFETs). Some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bipolar junction transistors-BJT PNP/NPN, BiCMOS, CMOS, etc., may be used for some transistors without departing from the scope of the disclosure.

It is pointed out that those elements of the figures having the same reference numbers (or names) as the elements of any other figure can operate or function in any manner similar to that described, but are not limited to such.

FIG. 1A shows features of a system 100 to regulate a temperature of a resonator according to an embodiment. System 100 is one example of an embodiment wherein a thermoelectric cooler (TEC) is thermally coupled with a resonator structure which extends over a first region of a substrate, wherein the resonator structure and the TEC overlap one another. The TEC is coupled to provide thermal regulation of the resonator structure, which is used to generate a master clock signal (or other such oscillatory signal).

As shown in FIG. 1A, system 100 comprises one or more resonators 110 which are to couple to an oscillator circuit 130 that is included in (or alternatively, is to be coupled to) system 100. In some embodiments, oscillator circuit 130 includes any of various circuits which provide functionality to generate an oscillatory (e.g., periodic) signal 132 with the one or more resonators 110—e.g., wherein signal 132 is provided to a circuit resource (such as the illustrative processor 140 shown) that is included in, or is to couple to, system 100. The one or more resonators 110 include any of a variety of resonator structures which are suitable to facilitate a cyclical varying of oscillatory signal 132—e.g., wherein a resonance characteristic of at least one such resonator contributes to a frequency and/or a magnitude of oscillations by oscillatory signal 132.

In an example embodiment, one such resonator is coupled to provide to oscillator circuit 130 a signal 112, where an impedance provided with the resonator exhibits a local minimum—or alternatively, a local maximum—at a particular frequency in a range of possible frequencies for signal 112. By way of illustration and not limitation, the one or more resonators 110 comprise a microelectromechanical system resonator, a piezoelectric resonator, a crystal (e.g., quartz) resonator, and/or the like. In one such embodiment, oscillator circuit 130 comprises phased lock loop circuitry including, for example, a phase (or frequency) detector, a loop filter, a charge pump, a frequency divider and/or the like. However, some embodiments are not limited to a particular type of resonator for which thermal regulation is to be provided and/or to a particular oscillator circuit which is to generate an oscillatory signal. For example, in some embodiments, the one or more resonators 110 and/or oscillator circuit 130 include structures that are adapted from conventional mechanisms for generating a clock signal (or other such oscillatory signal).

In some embodiments, system 100 further comprises one or more sensors 150 which are operable to detect a condition of the one or more resonators 110 at a time when oscillatory signal 132 is provided at oscillator circuit 130. In one such embodiment, the one or more sensors 150 include a thermal sensor which is configured to detect a temperature of a region 160 which includes, adjoins or is otherwise proximate to the one or more resonators 110. By way of illustration and not limitation, one such thermal sensor comprises a bipolar diode which is biased with a constant current, where a voltage across the diode varies with temperature. However, some embodiments are not limited to a particular type of thermal sensor (if any) of the one or more sensors 150. For example, in some embodiments, the one or more sensors 150 comprise any of various suitable temperature sensors which are known in the art.

In some embodiments, the one or more sensors 150 additionally or alternatively comprise sensor circuitry to detect a difference between respective frequencies of a reference signal (not shown) and one of signals 112, 132. Detection of such a frequency difference is indicative, for example, of a temperature of the one or more sensors 150. In various embodiments, such sensor circuitry is adapted, for example, from any of various conventional sensors to detect a frequency difference between a given two signals.

In an embodiment, system 100 further includes (or is to couple to) control circuitry 170 which is operable to receive from the one or more sensors 150 a sensor signal 152 which indicates a detected condition of the one or more resonators 110. Control circuitry 170 provides functionality to generate a control signal 172 based on sensor signal 152—e.g., where control signal 172 is communicated to determine at least in part an operation of a thermoelectric cooler (TEC) 120 of system 100. In various embodiments, control circuitry 170 is programmed or otherwise configured to include, or otherwise have access to, reference information which specifies or otherwise indicates one or more test criteria which each correspond to a respective operational condition of system 100. By way of illustration and not limitation, a given test criterion specifies or otherwise indicates a respective temperature range that, for example, is defined at least in part by a threshold minimum temperature and/or a threshold maximum temperature. The information further indicates, for example, a particular type of temperature regulation (e.g., including a particular rate of cooling or heating) which is to be implemented in instances where it is determined that a corresponding test criterion has been satisfied. In an illustrative scenario for one embodiment, control circuitry 170 detects that a temperature indicated by sensor signal 152 is within such a temperature range. In response to such detecting, control circuitry 170 communicates via control signal 172 a particular cooling (or heating) to be provided with TEC 120.

In one example embodiment, TEC 120 provides Peltier effect functionality—e.g., wherein TEC 120 comprises p-type semiconductor elements and n-type semiconductor elements which are connected electrically in series with each other. Such elements include bismuth telluride, for example, although TEC 120 comprises additional or alternative semiconductor materials, in other embodiments. An application of a DC voltage across such an in-series arrangement results in heat being transferred from one side of TEC 120 to the other. Alternatively or in addition, TEC 120 is operable to provide Seebeck effect functionality wherein heat is converted to DC power. Some embodiments are not limited to a particular number, type and/or relative arrangement of semiconductor elements in TEC 120 to facilitate cooling and/or heating.

In the illustrative embodiment shown, TEC 120 is thermally coupled to the one or more resonators 110 via an interface region 115. In various embodiments, respective structures of TEC 120 and the one or more resonators 110 are variously soldered, bonded, deposited on and/or otherwise coupled, directly or indirectly, to a substrate (not shown) such as a silicon interposer or a package substrate. In some embodiments, the one or more resonators 110 and/or TEC 120 are bonded to the substrate via a heat shield or other such structure. In one such embodiment, the substrate comprises interconnect structures which variously extend therein—e.g., where the interconnect structures are coupled to provide to the one or more resonators 110 and/or to TEC 120 one or more voltages (e.g., including a supply voltage and a ground or other such reference voltage). Alternatively or in addition, interconnect structures of the substrate are coupled to variously communicate one or more signals each to or from a respective one of the one or more resonators 110 or TEC 120.

In some embodiments, respective structures of TEC 120 and resonator overlap one another along a line which extends orthogonally from a surface of the substrate. In one such embodiment, a first integrated circuit (IC) chip has respective structures of the one or more resonators 110 and TEC 120 variously integrated therein or thereon. In another such embodiment, a first IC chip and a second IC chip are each arranged in a stacked configuration on a package substrate, wherein the first IC chip has structures of the one or more resonators 110 integrated therein or thereon, and where the second IC chip has structures of TEC 120 integrated therein or thereon.

In various embodiments, a region is located between, and extends to each of, TEC 120 and the one or more resonators 110, where any circuitry (e.g., comprising processor circuitry), which is to perform operations which are synchronized based on the oscillatory signal is, outside of said region. In one such embodiment, said region between TEC 120 and the one or more resonators 110 omits any portion of a semiconductor substrate other than one which has integrated therein or thereon structures of TEC 120 or structures of the one or more resonators 110. Such a region omits any portion of a semiconductor substrate, in some embodiments—e.g., where any substrate does not extend into the region. For example, in some embodiments, any structure in a region between one or more resonators 110 and thermoelectric cooler 120 is a bulk material to facilitate heat conduction and/or to provide electrical insulation. Alternatively or in addition, any circuitry which extends between one or more resonators 110 and thermoelectric cooler 120 is one of a signal trace to communicate one of signal 152 or control signal 172, or circuitry of the one or more sensors 150. In some embodiments, one or more resonators 110 and thermoelectric cooler 120 comprise respective housing structures which adjoin one another. In providing thermal regulation with a TEC 120 which is proximate to the one or more resonators 110—where TEC 120 and the one or more resonators 110 are thermally interfaced with one another at region 115—some embodiments variously enable a power efficient regulation mechanism to mitigate frequency drift of an oscillatory signal across a wide range of temperatures.

In some embodiments, system 100 omits some or all of oscillator circuit 130, processor 140, and control circuitry 170—e.g., wherein system 100 is a device, comprising one or more resonators 110, thermoelectric cooler 120 and one or more sensors 150, which supports various coupling to (and in some embodiments, packaging with) oscillator circuit 130, processor 140, and control circuitry 170. By way of illustration and not limitation, in some embodiments, a first IC chip comprises oscillator circuit 130, processor 140, and control circuitry 170, wherein the first IC chip is coupled to a packaged device which includes a second one or more IC chips comprising the one or more resonators 110, thermoelectric cooler 120, and the one or more sensors 150. In one example embodiment, system 100 comprises oscillator circuit 130, processor 140, control circuitry 170, and an insulator material (not shown) which extends at least partially in region 160. For example, in some embodiments, an exterior surface of such an insulator material extends between the one or more resonators 110 and processor 140—e.g., where the insulator material extends at least partially around the one or more resonators 110, but does not extend between TEC 120 and some or all of the one or more resonators 110, and does not further extend over processor 140.

In some embodiments, TEC 120 and the one or more resonators 110 are in distinct packaged devices which are adjacent to one another at interface region 115. In other embodiments, TEC 120 and the one or more resonators 110 are integrated on different respective integrated circuit (IC) chips which, for example, are arranged in a stacked configuration. In still other embodiments, a single IC chip has variously integrated therein or thereon a vertical arrangement of respective structures of TEC 120 and the one or more resonators 110.

In the example embodiment shown, oscillatory signal 132 is provided to processor 140—e.g., where oscillatory signal 132 is to function as a master clock signal to facilitate a synchronization of operations by processor 140. In an alternate embodiment, oscillatory signal 132 is instead provided to a clock tree, frequency multiplier and/or other such circuitry (not shown) which is operable to generate one or more other clock signals based on oscillatory signal 132—e.g., where the one or more other clock signals are variously communicated to processor 140 and/or any of various other circuit resources which are included in, or are to couple to, system 100. However, some embodiments are not limited to a particular circuit resource that is to receive oscillatory signal 132, and/or to a particular operation performed by such a circuit resource based on the received oscillatory signal 132.

In some embodiments, system 100 is a packaged device, wherein TEC 120 dynamically heats or cools the one or more resonators 110 based on signal 152 indicating to control circuitry 170 a flux of heat from processor 140 through a package mold of system 100. In one embodiment, control circuitry 170 operates TEC 120 to keep the one or more resonators 110 at or below an average temperature of processor 140 (where, for example, the average is across different workloads of processor 140).

Figure 1B:
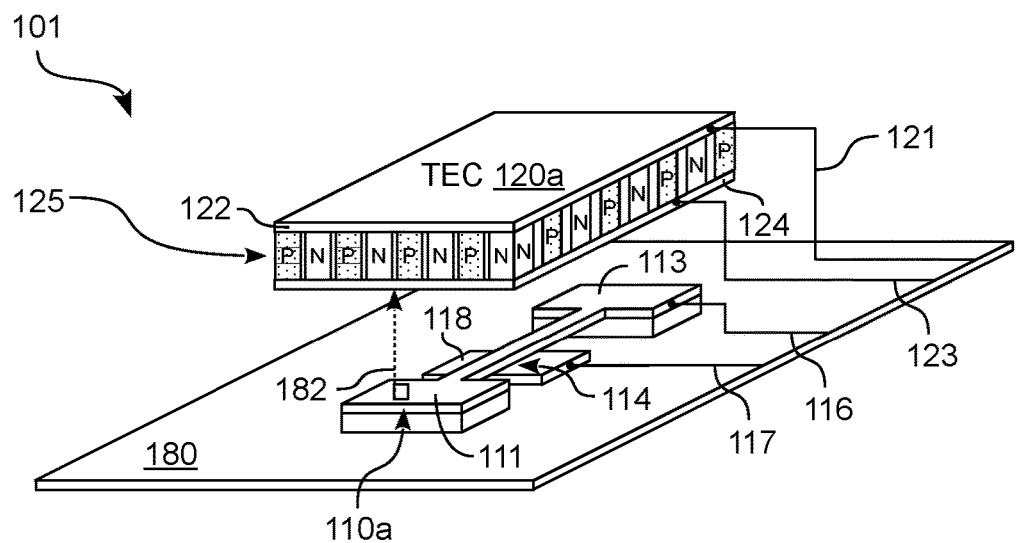
FIG. 1B is a perspective view of a device to mitigate frequency drift of an oscillatory signal according to an embodiment.

FIG. 1B shows features of a device 101 to mitigate frequency drift of an oscillatory signal according to an embodiment. In some embodiments, device 101 includes features of system 100—e.g., wherein a MEMS resonator 110a and a thermoelectric cooler 120a of device 101 correspond functionally to the one or more resonators 110 and the thermoelectric cooler 120 (respectively).

Device 101 is one example of an embodiment which provides thermal regulation of a chip-based MEMS resonator structure that is used, for example, to induce a cyclically varying impedance for generating a clock signal. Referring to FIG. 1B, device 101 includes a bridge micromechanical resonator 110a. Resonator 110a is coupled at anchors 111, 113 but is otherwise free-standing. A capacitive transducer functionality is enabled at least in part by disposing an electrode 118 proximate to resonator 110a—e.g., where, in this case, a gap 114 is located between electrode 118 and resonator 110a.

By way of illustration and not limitation, operation of device 101 includes an application of a voltage difference across gap 114—e.g., where conductive traces 116, 117 of device 101 are coupled to provide different voltages at resonator 110a and electrode 118 (respectively). In one such embodiment, device 101 provides two terminals—with electrode 118 and resonator 110a, respectively—between which an impedance (at a given temperature) is relatively high at all frequencies other than a resonance frequency. At the resonance frequency, the impedance between the terminals becomes relatively low. Reliable generation of a consistent clock signal with such a capacitive transducer is complicated, for example, by variance of the resonance frequency with changes to the temperature of resonator 110a.

To mitigate such temperature changes, some embodiments further provide a thermoelectric cooler (TEC) 120a which is thermally coupled to (and, for example, proximate to) the capacitive transducer which includes resonator 110a. In the embodiment shown, TEC 120a comprises an arrangement of alternating p-type semiconductor elements and n-type semiconductor elements which are electrically coupled in series with each other. By way of illustration and not limitation, semiconductor elements of TEC 120a are arranged in an array 125—e.g., wherein interconnect structures 122 of TEC 120a variously provide electrical coupling between respective elements at one side of array 125, and interconnect structures 124 of TEC 120a variously provide electrical coupling between respective elements at an opposite side of array 125.

A conduction of heat which is transferred between TEC 120a and resonator 110a is enabled by the application of a voltage difference across an in-series arrangement of elements in array 125—e.g., wherein conductive traces 121, 123 of device 101 are coupled to provide different voltages to interconnect structures 122 and interconnect structures 124 (respectively). Based on such a voltage difference, TEC 120a is operable to selectively conduct heat from (or alternatively, toward) resonator 110a.

In various embodiments, respective structures of TEC 120a and resonator 110a are variously soldered, bonded, deposited on and/or otherwise coupled, directly or indirectly, to a substrate 180. In an embodiment, resonator 120a extends over a first region of a substrate 180, wherein a second region of substrate 180 (not shown) is configured to host other circuitry—e.g., that of processor 140—which is operable based on signal 132 or other such output of an oscillator circuit.

For example, respective structures of TEC 120a and resonator 110a overlap one another along a line 182 which extends orthogonally from a surface of substrate 180. In one such embodiment, a first integrated circuit (IC) chip has respective structures of resonator 110a and TEC 120a variously integrated therein or thereon. In one such embodiment, a region is located between, and extends to each of, TEC 120a and resonator 110a, where any circuitry (e.g., comprising processor circuitry) which is to perform operations which are synchronized based on the oscillatory signal is outside of said region. In one such embodiment, said region between TEC 120a and resonator 110a omits any portion of a semiconductor substrate other than one which has integrated therein or thereon structures of TEC 120a or structures of resonator 110a. Such a region omits any portion of a semiconductor substrate, in some embodiments—e.g., where any substrate does not extend into the region.

Figures 2A, 2B:
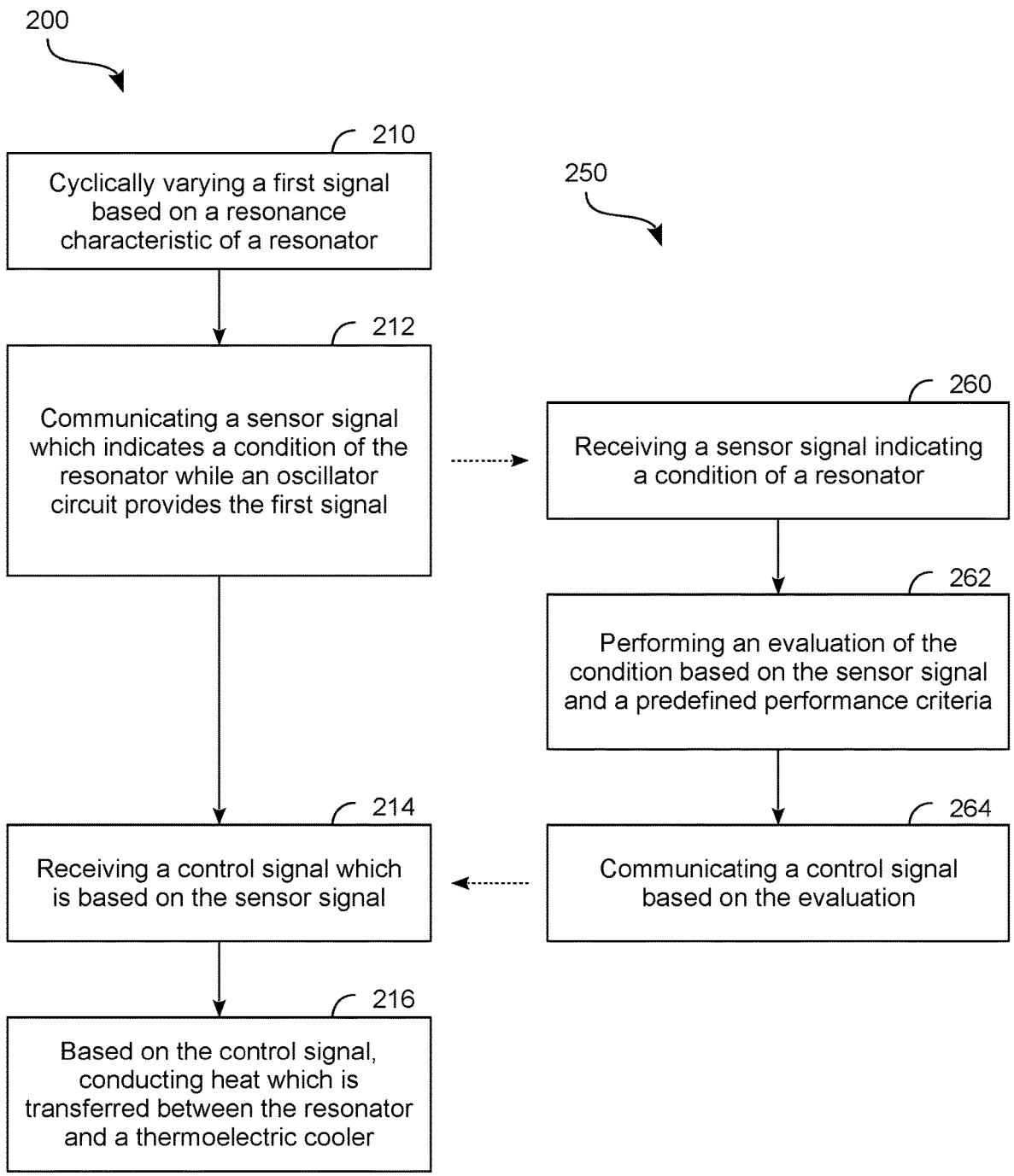
FIGS. 2A, 2B shows features of respective methods each to regulate a temperature of a resonator according to a corresponding embodiment.

FIGS. 2A, 2B variously show features of methods 200, 250 each to regulate the temperature of a respective resonator according to a corresponding embodiment. Method 200 is one example of an embodiment wherein a thermoelectric cooler is operated to conduct heat with a resonator that is proximate thereto—e.g., wherein method 250 is performed to control some or all operations by such a thermoelectric cooler. In some embodiments, method 200 is performed with a device such as one which includes the one or more resonators 110, the one or more sensors 150, and thermoelectric cooler 120—e.g., where method 250 is performed with control circuitry 170. For example, method 200 includes some or all of method 250, in some embodiments.

As shown in FIG. 2A, method 200 comprises (at 210) cyclically varying a first (periodic or otherwise oscillatory) signal of an oscillator circuit based on a resonance characteristic of a resonator. For example, the varying at 210 comprises oscillations of the signal 132 at oscillator circuit 130 being generated with a resonator of the one or more resonators 110—e.g., wherein such oscillations are based on an impedance which is provided with the resonator. In some embodiments, the resonator includes one of a MEMS resonator (e.g., resonator 110a), a piezoelectric resonator, or a crystal resonator. Although some embodiments are not limited in this regard, the first signal (or another oscillatory signal which is generated based on the first signal) is provided to synchronize operations at a processor and/or any of various other circuit resources. By way of illustration and not limitation, the first signal includes, or is to be a basis for, a master clock signal from which one or more other clock signals are derived.

Method 200 further comprises (at 212) communicating a sensor signal—e.g., signal 152—which indicates a condition of the resonator while an oscillator circuit provides the first signal. In an example embodiment, the sensor signal specifies or otherwise indicates a temperature of a region which includes, adjoins or is otherwise proximate to the resonator.

Referring now to FIG. 2B, method 250 comprises (at 260) receiving a sensor signal such as that which is communicated at 212 of method 200. For example, in some embodiments, the receiving at 260 includes control circuitry 170 receiving signal 152 from the one or more sensors 150. Method 250 further comprises (at 262) performing an evaluation of the indicated condition, wherein the evaluation is based on the sensor signal and a predefined performance criteria. Such an evaluation includes, for example, determining whether a particular one of multiple test criteria is satisfied—e.g., wherein the multiple test criteria correspond to different respective modes each to provide a corresponding thermal regulation of the resonator. Method 250 further comprises (at 264) communicating a control signal which is based on the evaluation performed at 262—e.g., wherein the control signal is to determine at least in part an operation of a TEC which is proximate to the resonator.

Referring again to FIG. 2A, method 200 further comprises (at 214) receiving a control signal at a thermoelectric cooler (TEC) which is thermally coupled with—and, for example, proximate to—the resonator, wherein the control signal is based on the sensor signal that is communicated at 212. In one example embodiment, the receiving at 214 comprises thermoelectric cooler 120 receiving control signal 172 from control circuitry 170. Method 200 further comprises (at 216)

conducting heat which is transferred between the resonator and the TEC, where such conducting is based on the control signal.

In some embodiments, for any substrate which extends between respective structures of the TEC and the resonator, one of the TEC or the resonator includes structures which are integrated in or on the substrate. For example, heat is conducted at 216 via a path from the resonator to the TEC (or alternatively, from the TEC to the resonator) through a region which omits any circuitry that performs operations which are synchronized based on the oscillatory signal is outside of said region.

For example, in various embodiments, an IC chip comprises both the TEC and the resonator—e.g., wherein respective structures of the TEC and the resonator are offset vertically from one another. In one such embodiment, the IC chip further comprises the oscillator circuit and a processor, operations of which are to be synchronized based on the first signal. In other embodiments, the TEC and the resonator variously include, or are disposed in, respective housings which are adjacent to each other. Alternatively or in addition, a packaged device comprises the resonator, the TEC, and (for example) a sensor which generates the sensor signal that is communicated at 212. In one such embodiment, the packaged device is coupled to an IC chip which comprises a processor, operations of which are synchronized based on the first signal. In various embodiments, a first package device includes the resonator and the TEC—e.g., wherein a package-in-package device includes the first packaged device and an adjoining structure (e.g., one of an interposer or a heat spreader) which is coupled to conduct heat with the TEC.

Figure 3A:
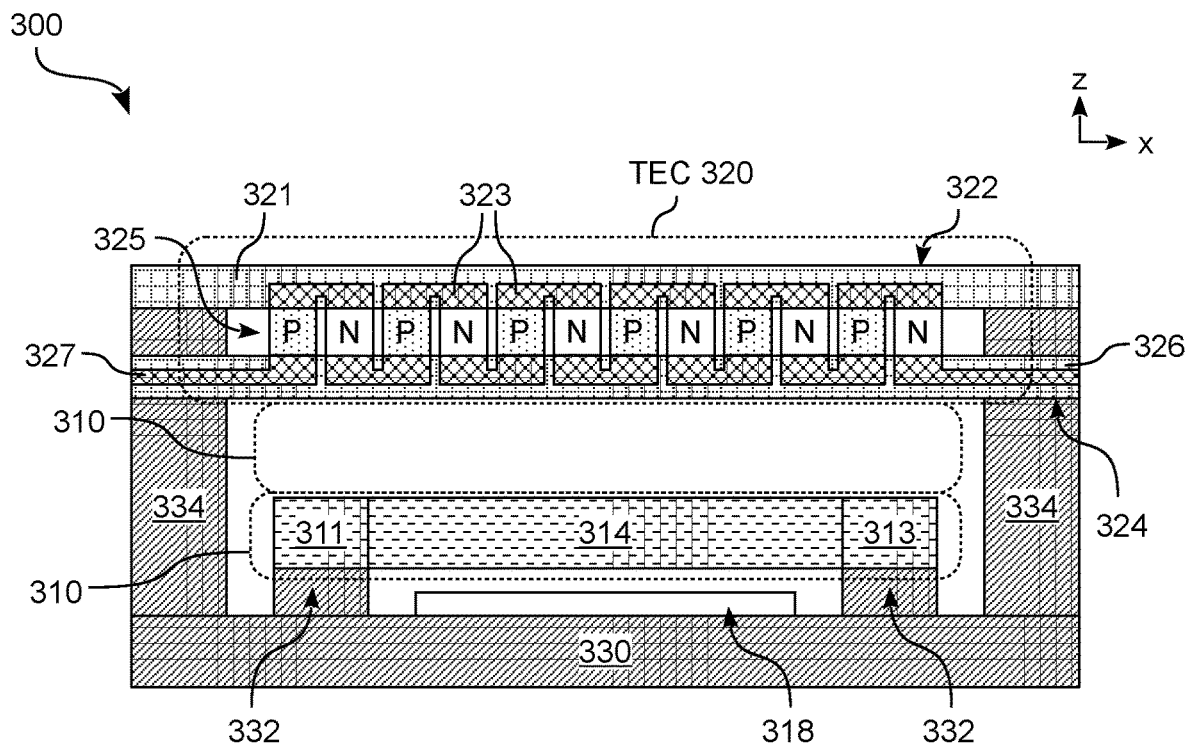
FIGS. 3A and 3B show various cross-sectional views of a respective device to mitigate frequency drift of a clock signal according to an embodiment.
Figure 3B:
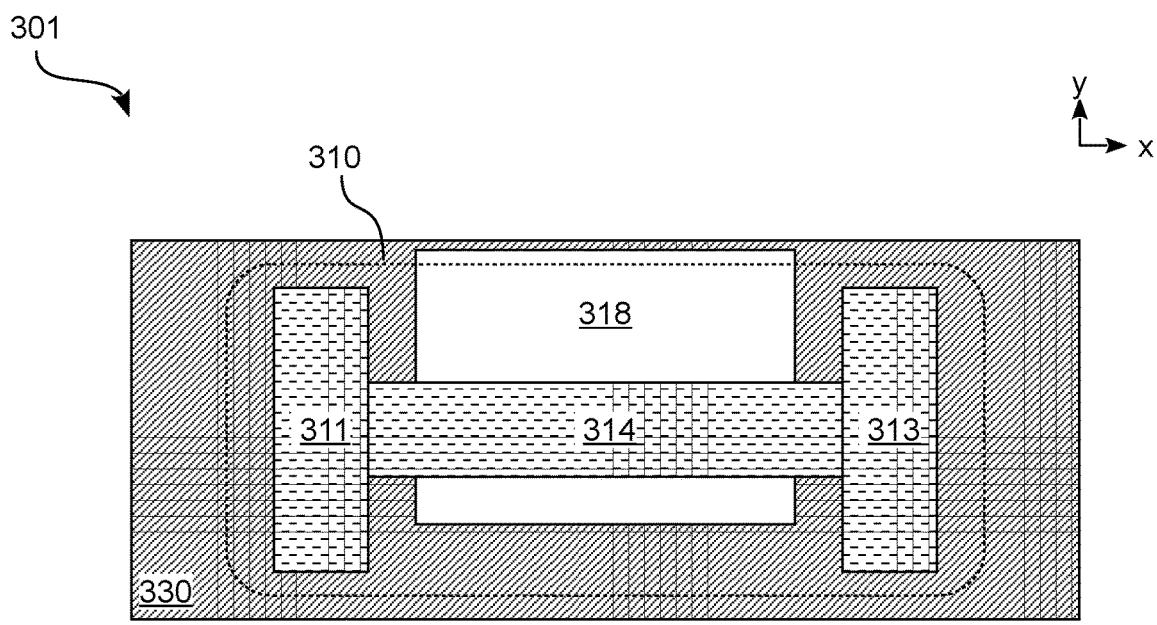

FIGS. 3A, 3B variously show respective cross-sectional views of a device 300 to mitigate frequency drift of a clock signal according to an embodiment. More particularly, FIG. 3A shows features of device 300 which variously extend in a x-z plane of an xyz coordinate system, and FIG. 3B shows a cross-sectional view 301 illustrating structures of device 300 which are in a x-y plane of the xyz coordinate system. Device 300 includes features of one of system 100, in some embodiments—e.g., wherein method 200 and/or method 250 facilitate thermal regulation with device 300.

In some embodiments, device 300 provides functionality of device 101—e.g., wherein anchor structures 311, 313 and an electrode 318 of device 300 correspond functionally to anchor structures 111, 113 and electrode 118 (respectively). In one such embodiment, device 300 further comprises interconnect structures 322, interconnect structures 324, and an array 325 of semiconductor elements—e.g., corresponding functionally to interconnect structures 122, interconnect structures 124, and array 125 (respectively).

As shown in FIG. 3A, device 300 includes a micro-bridge resonator structure 310 which is formed on a portion of a substrate 330. Substrate 330 is, for example, a semiconductor (e.g., silicon) substrate suitable as a base structure for MEMS applications. It is appreciated that other substrates, such as glass (including silicon on insulator) and ceramic substrates are suitable in various embodiments. Substrate 330 variously provides contact points (e.g., pads, terminals, etc.), disposed on its surface, on which device structures (e.g., electrodes) are to be variously formed. Additionally or alternatively, conductive traces variously extend in the body of substrate 330 to connect contact points on the substrate to one another or to another substrate. In some embodiments, substrate 330 further has one or more device levels, including interconnect levels, formed thereon.

In one embodiment, micro-bridge resonator structure 310 is formed by a series of additive processes and subtractive processes (e.g., including deposition, etch patterning and/or other processing) that, for example, are adapted from conventional IC fabrication processes. Micro-bridge resonator structure 310 includes, for example, a polycrystalline silicon bridge shown, in this view, to comprise anchor structures 311, 313 variously overlying respective support structures 332 and beam 314 disposed above electrode 318. Beam 314 is, in one sense, supported between anchor structures 311, 313 but is otherwise free-standing. In this embodiment, z-direction thickness of support structures 332 of, for example, silicon dioxide ($SiO_2$), separate beam 314 from substrate 330. Electrode 318 is illustrated adjacent beam 314—e.g., wherein a gap is disposed therebetween.

It is appreciated that, once formed, micro-bridge resonator structure 310 will exhibit a particular resonating frequency that, for example, is susceptible to variation with temperature changes to micro-bridge resonator structure 310. To mitigate such temperature changes, device 300 further comprises a thermoelectric cooler 320 which is thermally coupled to (and, for example, adjacent or otherwise proximate to) micro-bridge resonator structure 310. For example, device 300 further comprises support structures 334—for example, comprising silicon dioxide ($SiO_2$)—a z-direction thickness of which allows for vibration of beam structure 314 while also facilitating efficient heat transfer (e.g., via radiation or conduction) between micro-bridge resonator structure 310 and thermoelectric cooler 320. In an embodiment, such heat transfer is via a path through a region 317 which is between (and extends to each of) micro-bridge resonator structure 310 and thermoelectric cooler 320—e.g., wherein the region 317 omits any circuitry which is to perform operations which are synchronized based on an oscillatory signal that is generated with resonator structure 310. In one such embodiment, said region 317 omits any portion of a semiconductor substrate other than one which has integrated therein or thereon structures of TEC 320 or structures of resonator 310. Such a region 317 omits any portion of a semiconductor substrate, in some embodiments—e.g., where any substrate does not extend into region 317. Alternatively or in addition, region 317 omits any circuitry other than that which facilitates signal communication to operate one of micro-bridge resonator structure 310 or thermoelectric cooler 320. Alternatively or in addition, region 317 omits any bulk material other than that which facilitates heat conduction and/or electrical insulation, for example.

In various embodiments, TEC 320 is formed by a series of additive processes and subtractive processes (e.g., including deposition, etch patterning and/or other processing) that, for example, are adapted from conventional IC fabrication processes. In one such embodiment, respective structures of micro-bridge resonator structure 310 and thermoelectric cooler 320 are variously formed in or on the same substrate 330. In other embodiments, micro-bridge resonator structure 310 and thermoelectric cooler 320 are variously formed in or on different respective substrates which, for example, are subsequently arranged in a stacked configuration—e.g., wherein IC chips of a chip stack each include a different respective one of micro-bridge resonator structure 310 and thermoelectric cooler 320.

In the embodiment shown, TEC 320 comprises an array 325 of semiconductor elements—e.g., comprising an alternating arrangement of p-type semiconductor elements and n-type semiconductor elements which are electrically coupled in series with each other. By way of illustration and not limitation, interconnect structures 322 comprise an electrical insulator 321 and conductive traces 323 variously extending therein, wherein conductive traces 323 provide electrical coupling between respective semiconductor elements at a top side of array 325. Alternatively or in addition, interconnect structures 324 comprise an electrical insulator 326 and conductive traces 327 variously extending therein, wherein conductive traces 327 variously provide electrical coupling between respective semiconductor elements at a bottom side of array 325. A conduction of heat which is transferred between TEC 320 and micro-bridge resonator structure 310 is enabled by the application of a voltage difference—using conductive traces 323, 327—across an in-series arrangement of elements in array 325. Based on such a voltage difference, TEC 320 is operable to selectively conduct heat from (or alternatively, toward) resonator 310.

Figure 4A:
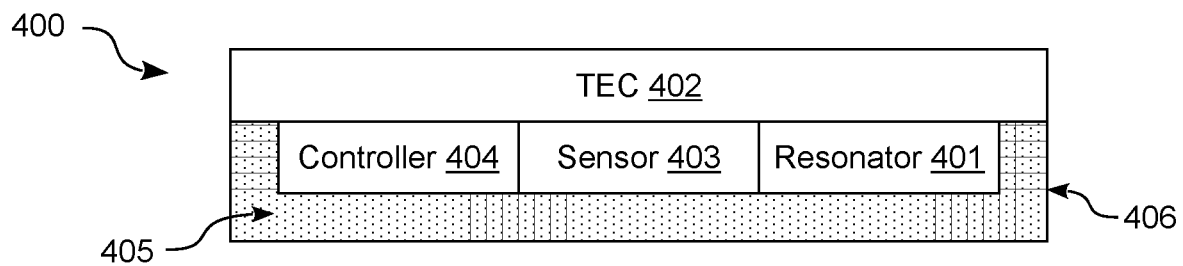
FIGS. 4A through 4D each show a cross-sectional side view of a respective device to control the temperature of a resonator according to an embodiment.

FIG. 4A shows features of a device 400 which provides functionality to regulate the temperature of a resonator structure according to an embodiment. Device 400 includes features of system 100 or one of devices 101, 300, in various embodiments—e.g., wherein device 400 is operable to facilitate the performance of method 200 and/or method 250.

For example, device 400 provides functionality of system 100—e.g., wherein a resonator 401, a thermoelectric cooler 402, a sensor 403, and a controller 404 of device 400 correspond functionally to one or more resonators 110, thermoelectric cooler 120, one or more sensors 150, and control circuitry 170 (respectively). In one such embodiment, device 400 further comprises an insulator 405 which extends over (and, for example, at least partially around) resonator 401. Insulator 405 comprises $SiO_2$ or any of various other suitable thermal insulator materials known in the art.

In various embodiments, insulator 405 is configured to facilitate heat transfer between resonator 401 and thermoelectric cooler 402, and further to mitigate heat transfer between resonator 401 and one or more other circuit structures (not shown) which are included in, or are to couple to, device 400. For example, at least a portion of insulator 405 (including, in some embodiments, an exterior surface 406 formed by insulator 405) is shaped or otherwise configured to extend between resonator 401 and said one or more other circuit structures—e.g., where at least a portion of resonator 401 is adjacent or otherwise proximate to another portion of thermoelectric cooler 402. Accordingly, insulator 405 facilitates thermal insulation of a region (e.g., region 160) in which is disposed resonator 401 and, in some embodiments, one or both of sensor 403 and controller 404.

Sensor 403 provides functionality to communicate to controller 404 a signal which indicates a condition of resonator 401—e.g., a temperature—at a time when an oscillatory signal is being provided with an oscillator circuit (not shown) based on a resonance characteristic of resonator 401. Based on the condition indicated by sensor 403, controller 404 selectively controls operation of thermoelectric cooler 402 to cool (or alternatively, to heat) resonator 401.

Figure 4B:
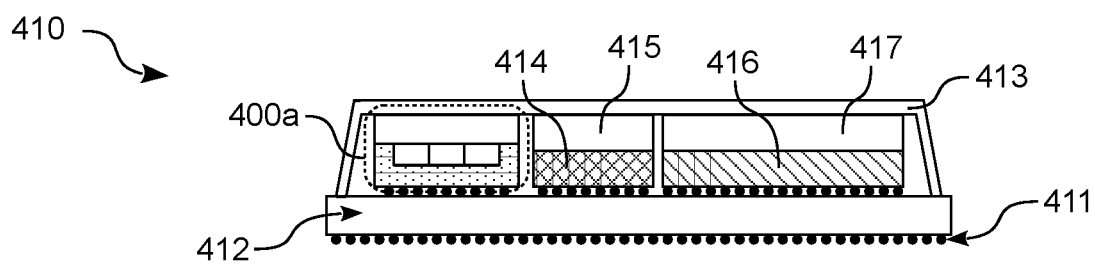

FIG. 4B shows features of a package 410 to regulate a resonator temperature according to another embodiment. Package 410 includes features of system 100 (or of one of devices 101, 300) and/or facilitates performance of one of methods 200, 250, for example.

As shown in FIG. 4B, package 410 comprises a die carrier substrate 412 with one or more IC dies (such as the illustrative IC dies 414, 416 shown) mounted thereon. A heat spreader structure 413 is adhered to or otherwise mounted on die carrier substrate 412. Thermal interface material structures 415, 417 are variously disposed between IC dies 414, 416 (respectively) and heat spreader structure 413 to facilitate heat removal. Solder bumps are variously placed on bonding pads which are located each on a respective one of IC dies 414, 416 and die carrier substrate 412. In a "flip-chip" attachment process, IC dies 414, 416 are flipped upside down and attached directly to die carrier substrate 412—e.g., by respective solder bumps on IC dies 414, 416 and solder bumps on carrier 412 joining to form various solder joints. These traditional flip chip packages, whether ball grid array (BGA) or pin grid array (PGA) packages, have solder bumps (e.g., including C4 bumps). A hardware interface 411 of device 400a (e.g., the hardware interface 411 comprising a ball grid array) facilitates coupling of device 400a to a printed circuit board—e.g., wherein die carrier substrate 412 comprises conductive traces which variously extend to facilitate electrical coupling between hardware interface 411 and IC chips 414, 416.

In various embodiments, package 410 further comprises a device 400a that (for example) includes features of device 400—e.g., where device 400a is another packaged device of a package-in-package configuration. In one such embodiment, device 400a provides functionality of resonator 401, thermoelectric cooler 402, sensor 403, controller 404, and insulator 405. By way of illustration and not limitation, one of IC dies 414, 416 includes an oscillator circuit which is coupled to a resonator of device 400a—e.g., where IC dies 414, 416 further comprise a processor which is to operate based on an oscillatory signal that is generated with the oscillator circuit. In one such embodiment, the oscillator circuit is coupled to a resonator of device 400a, wherein oscillations of the oscillatory signal are based on a resonance characteristic of said resonator. To regulate a temperature of such a resonator, device 400a further comprises a TEC which is adjacent or otherwise proximate to the resonator. In the example embodiment shown, device 400a is coupled directly to heat spreader structure 413—e.g., where the TEC of device 400a is operable to conduct heat between the resonator and heat spreader structure 413.

Figure 4C:
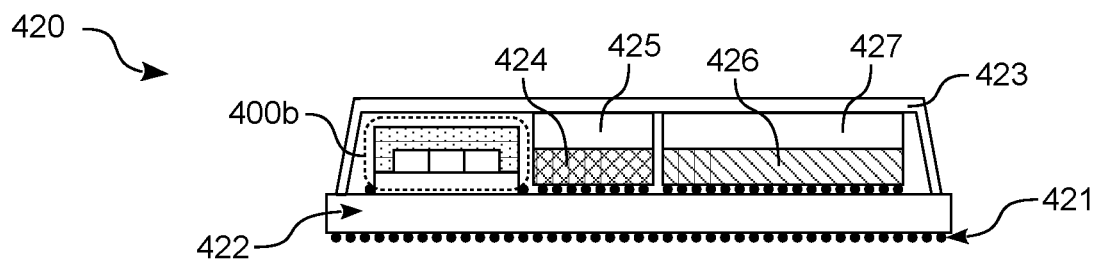

FIG. 4C shows features of a package 420 to regulate a resonator temperature according to another embodiment. Package 420 includes features of system 100 and/or facilitates performance of one of methods 200, 250, for example. In various embodiments, package 420 provides functionality of package 410—e.g., wherein package 420 comprises a hardware interface 421, a die carrier substrate 422, a heat spreader structure 423, IC dies 424, 426, and thermal insulation material structures 425, 427 that correspond functionally to hardware interface 411, die carrier substrate 412, heat spreader structure 413, IC dies 414, 416, and thermal insulation material structures 415, 417 (respectively). In one such embodiment, package 420 further comprises a device 400b that (for example) includes features of device 400—e.g., where device 400b provides functionality of resonator 401, thermoelectric cooler 402, sensor 403, controller 404, and insulator 405. In the example embodiment shown, device 400b is coupled directly to die carrier substrate 422—e.g., where a TEC of device 400b is operable to conduct heat between a resonator of device 400b and die carrier substrate 422.

Figure 4D:
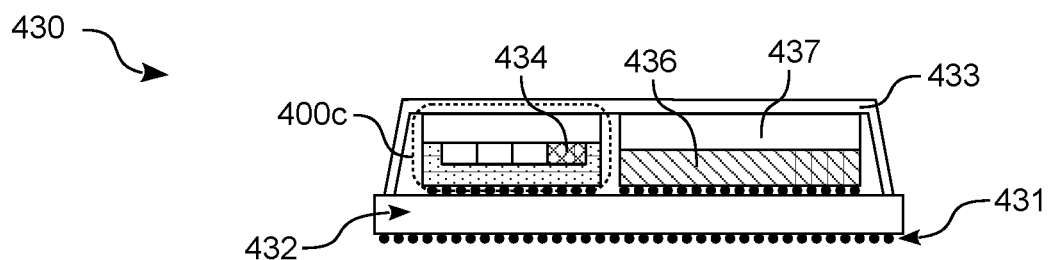

FIG. 4D shows features of a package 430 to regulate a resonator temperature according to another embodiment. Package 430 includes features of system 100 and/or facilitates performance of one of methods 200, 250, for example. In various embodiments, package 430 provides functionality of package 410—e.g., wherein package 430 comprises a hardware interface 431, a die carrier substrate 432, a heat spreader structure 433, IC die 436, and thermal insulation material structure 437 that correspond functionally to hardware interface 411, die carrier substrate 412, heat spreader structure 413, IC die 416, and thermal insulation material structure 417 (respectively).

In one such embodiment, package 430 further comprises a device 400c that (for example) includes features of device 400—e.g., where device 400c provides functionality of resonator 401, thermoelectric cooler 402, sensor 403, controller 404, and insulator 405. Although some embodiments are not limited in this regard, device 400c includes an oscillator circuit 434 which is coupled to a resonator of device 400c—e.g., where IC die 416 comprise a processor which is to operate based on an oscillatory signal that is generated with oscillator circuit 434. In one such embodiment, oscillator circuit 434 is coupled to a resonator of device 400c, wherein oscillations of the oscillatory signal are based on a resonance characteristic of said resonator. To regulate a temperature of such a resonator, device 400c further comprises a TEC which is adjacent or otherwise proximate to the resonator. In the example embodiment shown, device 400c is coupled directly to heat spreader structure 413—e.g., where the TEC of device 400c is operable to conduct heat between the resonator and heat spreader structure 413.

Figure 5A:
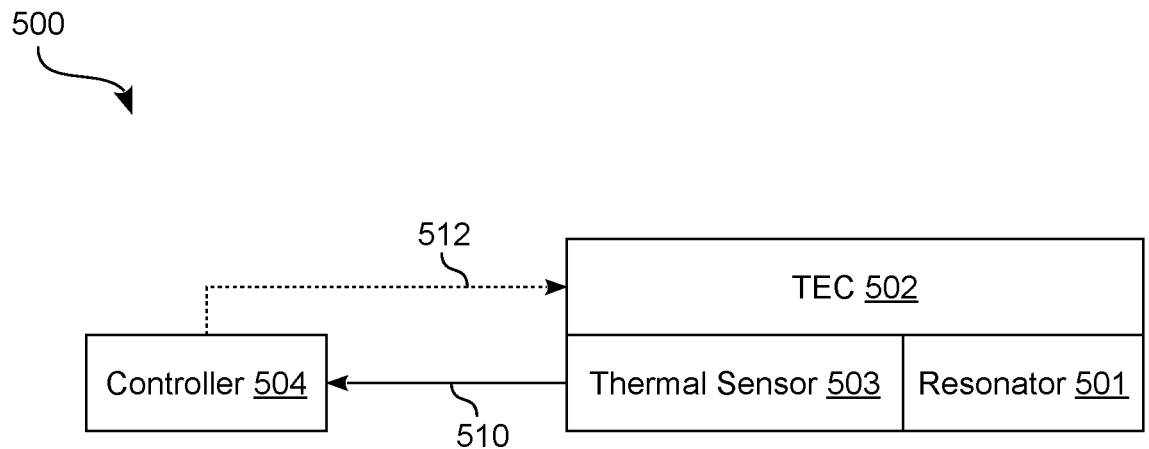
FIGS. 5A and 5B are functional block diagrams each illustrating elements of a respective device to regulate a frequency of a clock signal according to a corresponding embodiment.

FIG. 5A shows features of a device 500 to regulate a frequency of a clock signal according to an embodiment. Device 500 is one example of an embodiment wherein a thermal sensor provides a basis for regulating the temperature of a resonator with a TEC which is adjacent or otherwise proximate thereto. Device 500 includes features of system 100 or one of devices 101, 300, 400, for example.

As shown in FIG. 5A, device 500 comprises a resonator 501, a TEC 502, a thermal sensor 503, and a controller 504 which—for example—correspond functionally to one or more resonators 110, TEC 120, one or more sensors 150, and control circuitry 170 (respectively). Device 500 comprises interconnect structures (not shown) to facilitate coupling of resonator 501 to an oscillator circuit which is to generate an oscillatory signal. Oscillations of such a signal are generated, for example, based on a resonance characteristic of resonator 501. In one such embodiment, operation of device 500 includes thermal sensor 503 generating a signal 510 while such an oscillatory signal is being provided with the oscillation circuit. Signal 510 specifies or otherwise indicates a detected temperature of a region which includes, adjoins or is otherwise proximate to resonator 501. Based on the indicated temperature, controller 504 generates a control signal 512 for operation of TEC 502. Responsive to control signal 512, TEC 502 conducts heat which is transferred via a path which extends between (and to each of) resonator 501 and TEC 502, where the path omits any substrate—e.g., any semiconductor substrate—other than one which has structures of TEC 502 or resonator 501 integrated therein or thereon.

Figure 5B:
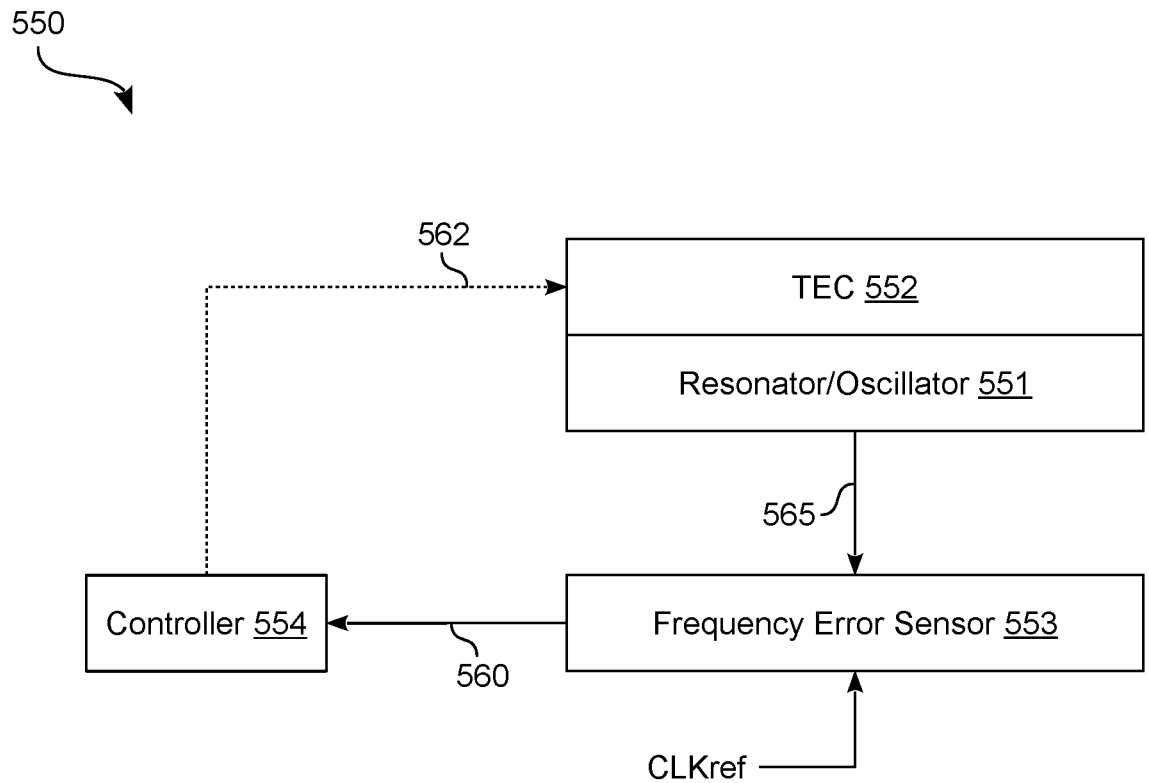

FIG. 5B shows features of a device 550 to regulate a frequency of a clock signal according to another embodiment. Device 550 includes features of system 100 or one of devices 101, 300, 400, for example. As shown in FIG. 5B, device 550 comprises a resonator/oscillator 551, a TEC 552, a frequency error sensor 553, and a controller 554 which—for example—correspond functionally to one or more resonators 110, TEC 120, one or more sensors 150, and control circuitry 170 (respectively).

Resonator/oscillator 551 comprises a resonator structure and an oscillator coupled thereto, wherein the oscillator circuit is to generate an oscillatory signal 565 based on a resonance characteristic of the resonator structure. During operation of device 550, frequency error sensor 553 generates a signal 560 while oscillatory signal 565 is being provided with resonator/oscillator 551—e.g., wherein signal 560 specifies or otherwise indicates a difference between the respective frequencies of oscillatory signal 565 and a reference signal (such as the illustrative signal CLKref shown). Based on the indicated frequency difference, controller 554 generates a control signal 562 for operation of TEC 552. Responsive to control signal 562, TEC 552 conducts heat which is transferred via a path which extends between (and to each of) TEC 552 and the resonator structure of resonator/oscillator 551, where the path omits any substrate—e.g., any semiconductor substrate—other than one which has structures of TEC 552 or resonator/oscillator 551 integrated therein or thereon.

The resonator/oscillator 551, in some embodiments, is configured to provide a frequency modulation of oscillatory signal 565—e.g., to facilitate spread-spectrum clocking which distributes electromagnetic interference over a relatively wide range of frequencies. In one such embodiment, frequency error sensor 553 evaluates oscillatory signal 565 based on CLKref and a predefined threshold minimum frequency difference. Based on such evaluation, sensor signal 560 communicates to controller 554 that, for example, a difference between oscillatory signal 565 and CLKref exceeds the threshold minimum frequency difference.

Figure 6:
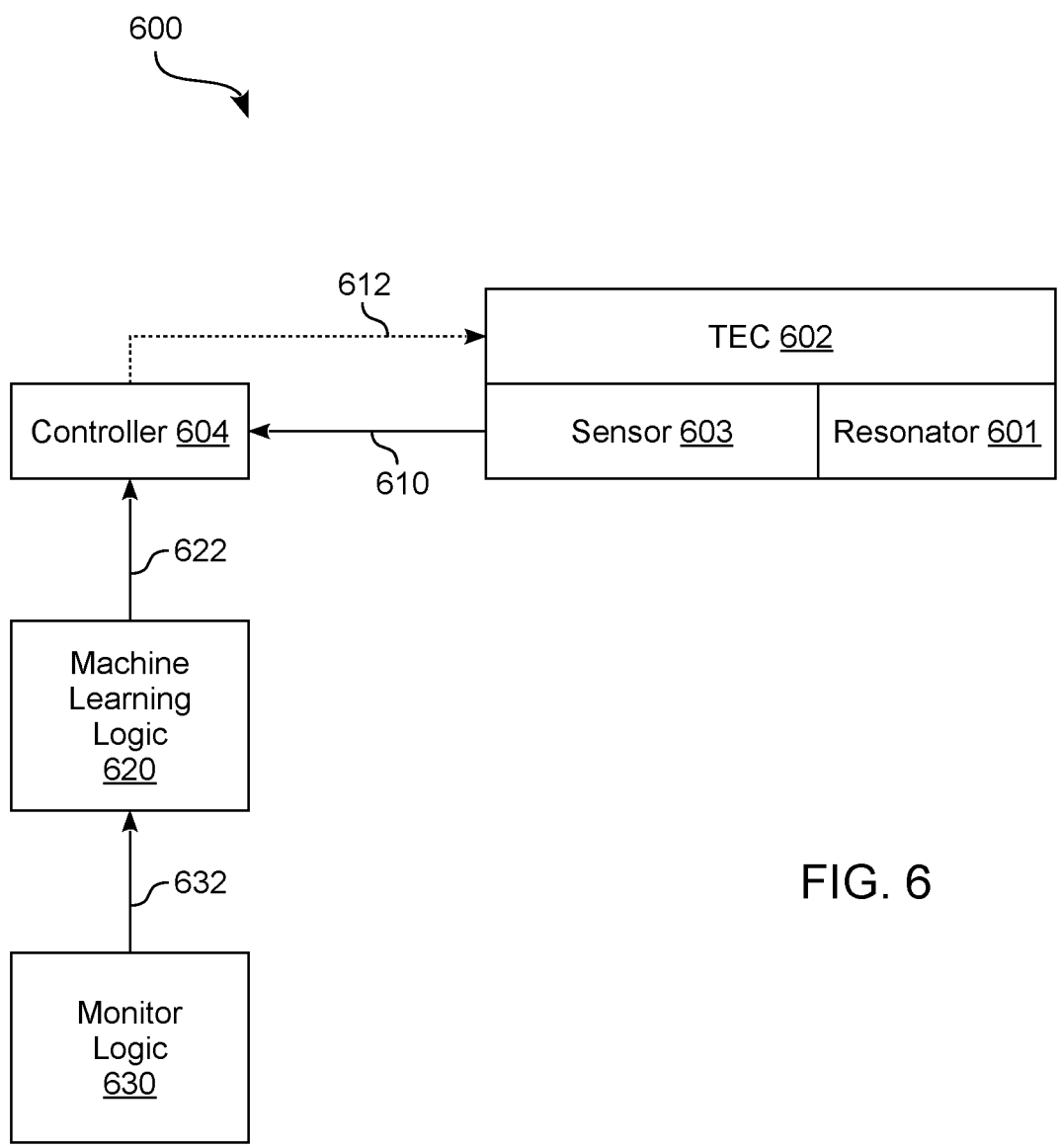
FIG. 6 is a functional block diagram illustrating elements of a device to control the temperature of a resonator according to an embodiment.

FIG. 6 shows features of a system 600 to mitigate frequency drift of an oscillatory signal according to an embodiment. System 600 includes features of system 100 and/or provides functionality to perform one of methods 200, 250, for example. As shown in FIG. 6, system 600 comprises a resonator 601, a TEC 602, a sensor 603, and a controller 604 which—for example—correspond functionally to resonator 501, TEC 502, thermal sensor 503, and controller 504 (respectively). In one such embodiment, operation of system 600 includes sensor 603 generating a signal 610 while an oscillatory signal is being provided with an oscillation circuit (not shown) which is coupled to resonator 601—e.g., where oscillations of the oscillatory signal are based on a resonance characteristic of resonator 601. Signal 610 specifies or otherwise indicates a detected temperature of resonator 601. Based on the indicated temperature, controller 604 generates a control signal 612 for operation of TEC 602 (which is adjacent to resonator 601).

Although some embodiments are not limited in this regard, generation of control signal 612 based on sensor signal 610 is based on feedback information which (for example) indicates a state of a processor and/or other circuit resources which operate based on the oscillatory signal. By way of illustration and not limitation, controller 604 supports proportional-integral-derivative (PID) functionality and/or any of various other mechanisms for adaptively determining operation of TEC 602 based on both signal 610 and other system state information.

In the example embodiment shown, system 600 includes—or alternatively, is to couple to—monitor logic 630 comprising any of various types of circuit logic which are suitable to track operational state of one or more functional blocks (not shown). Some or all such functional blocks are variously clocked based on the oscillatory signal, for example. Monitor logic 630 is operable to communicate a signal 632 which, for example, specifies or otherwise indicates a CPU power mode, a CPU workload and/or other such processor state (actual or expected). In one such embodiment, machine learning logic 620 of system 600 is operable, based on signal 632, to generate a control signal 622 to modify functionality of controller 604 for generating control signal 612 based on sensor signal 610.

Figure 7:
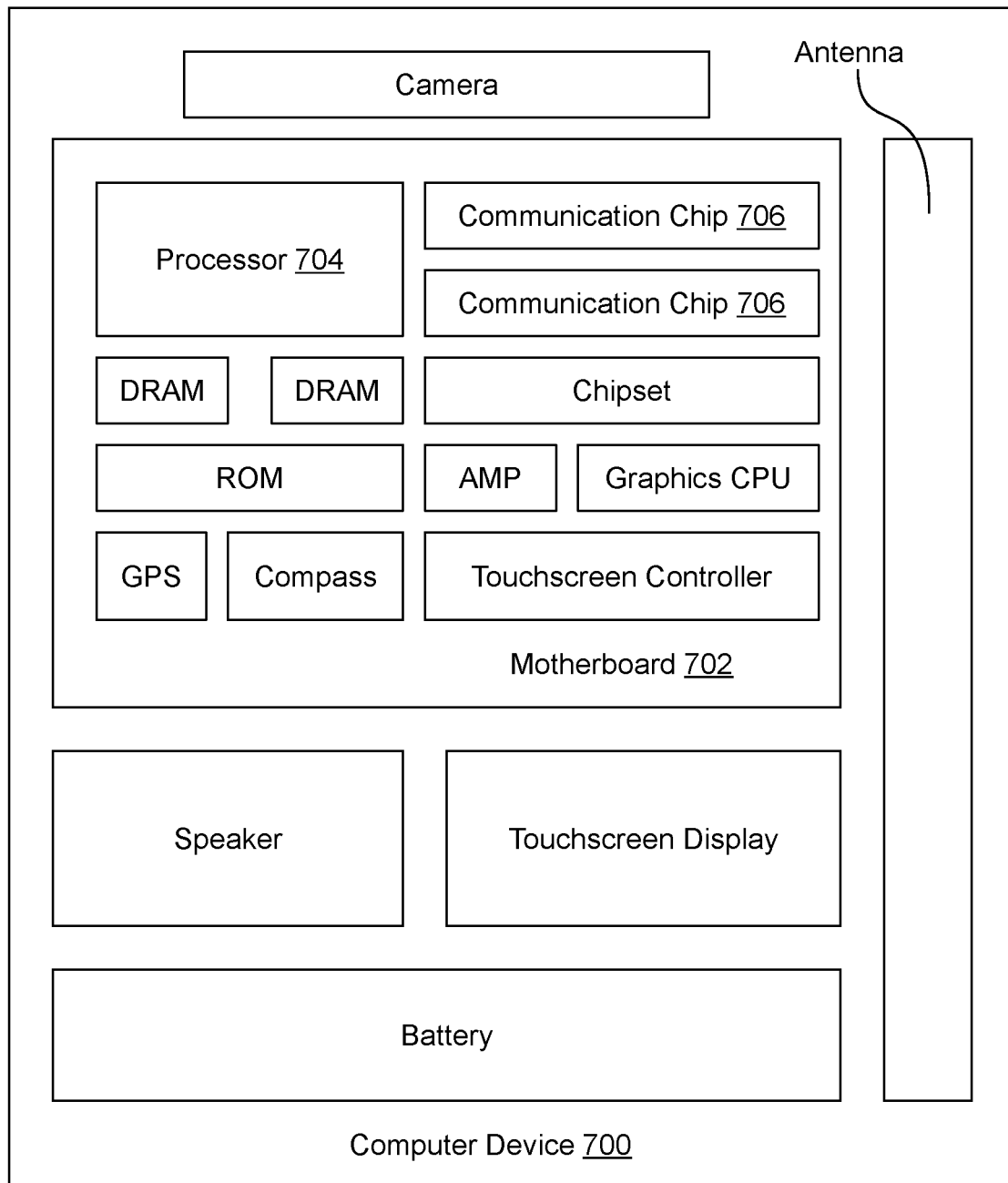
FIG. 7 is a functional block diagram illustrating a computing device in accordance with one embodiment.

FIG. 7 illustrates a computing device 700 in accordance with one embodiment. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. The term "processor" may refer to any device or portion of a device that processes electronic data from registers and/or memory to transform that electronic data into other electronic data that may be stored in registers and/or memory. The communication chip 706 also includes an integrated circuit die packaged within the communication chip 706.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
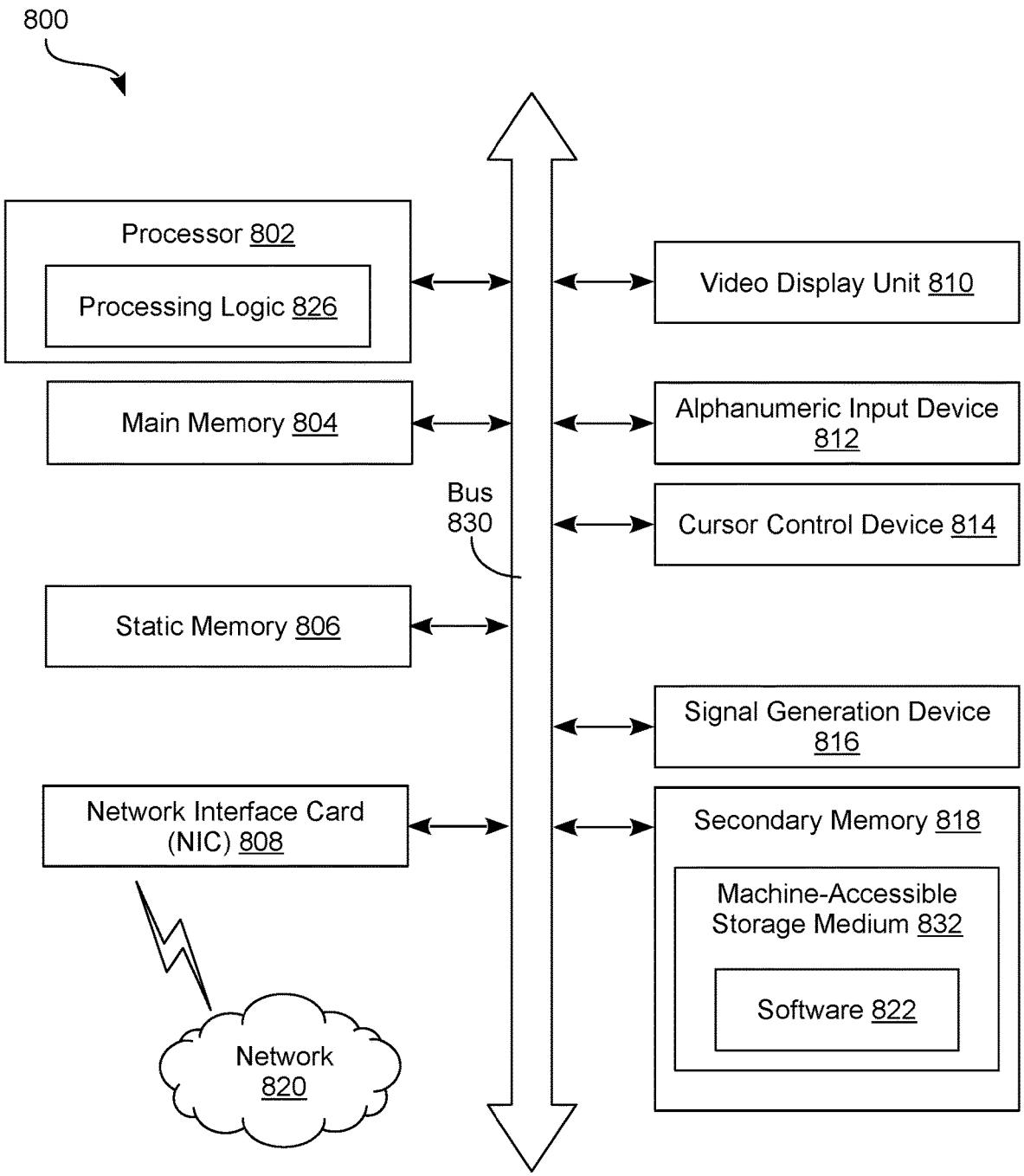
FIG. 8 is a functional block diagram illustrating an exemplary computer system, in accordance with one embodiment.

FIG. 8 illustrates a diagrammatic representation of a machine in the exemplary form of a computer system 800 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations described herein.

The computer system 800 may further include a network interface device 808. The computer system 800 also may include a video display unit 810 (e.g., a liquid crystal display (LCD), a light emitting diode display (LED), or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 832 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 832 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Techniques and architectures for managing a signal frequency are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device comprising:
   a substrate;
   a microelectromechanical (MEMS) resonator over a first region of the substrate, the MEMS resonator comprising a beam structure which extends over an electrode which is in or on the substrate, wherein the MEMS resonator is to couple to an oscillator circuit;
   a sensor to communicate a sensor signal indicative of a condition of the MEMS resonator; and
   a thermoelectric cooler (TEC) which overlaps the MEMS resonator, the TEC to transfer heat with the MEMS resonator based on the sensor signal, the TEC comprising:
      an array of semiconductor elements, wherein the array extends horizontally across an upper side of the MEMS resonator; and
      an interconnect structure at a first side of the array, the interconnect structure comprising an electrical insulator and conductive traces which extend therein, wherein the TEC is thermally coupled to receive a radiation of heat from the MEMS resonator to the interconnect structure;
   wherein the substrate comprises a second region to host first circuitry which is operable based on an output of the oscillator circuit.

2. The device of claim 1, wherein any circuitry which is to perform operations which are synchronized based on the output is outside of a region which is between, and extends to each of, the TEC and the MEMS resonator.

3. The device of claim 1, further comprising second circuitry coupled to the sensor and to the TEC, the second circuitry to:
receive the sensor signal;
perform an evaluation of the condition based on the sensor signal and a predefined performance criteria; and
communicate to the TEC a control signal based on the evaluation.

4. The device of claim 3, wherein the second circuitry is to operate the TEC to keep the MEMS resonator at or below an average temperature of a processor.

5. The device of claim 1, further comprising the first circuitry, wherein the first circuitry comprises a processor coupled to the oscillator circuit, wherein the processor comprises circuitry to synchronize operations based on the output.

6. The device of claim 5, further comprising an insulator which extends at least partially around the MEMS resonator, wherein the insulator extends between the MEMS resonator and the processor.

7. The device of claim 1, wherein integrated circuit chips of the device each comprise a different respective one of the TEC or the MEMS resonator.

8. The device of claim 1, wherein respective housings of the TEC and the MEMS resonator are adjacent to each other.

9. One or more computer-readable storage media having stored thereon instructions which, when executed by one or more processing units, cause the one or more processing units to perform a method comprising:
cyclically varying an output of an oscillator circuit, the varying with a microelectromechanical (MEMS) resonator which extends over a first region of a substrate, the MEMS resonator comprising a beam structure which extends over an electrode which is in or on the substrate, wherein first circuitry operates based on the output of the oscillator circuit, wherein the first circuitry extends over a second region of the substrate;
communicating a sensor signal which is indicative of a condition of the MEMS resonator; and
based on to the sensor signal, operating a thermoelectric cooler (TEC) to transfer heat between the MEMS resonator and the TEC, wherein the TEC overlaps the MEMS resonator, the TEC comprising:
an array of semiconductor elements, wherein the array extends horizontally across an upper side of the MEMS resonator; and
an interconnect structure at a first side of the array, the interconnect structure comprising an electrical insulator and conductive traces which extend therein, wherein the TEC is thermally coupled to receive a radiation of heat from the MEMS resonator to the interconnect structure.

10. The one or more computer-readable storage media of claim 9, wherein respective structures of the TEC and resonator overlap one another along a line extending orthogonally from a surface of the substrate, and wherein any circuitry which is to perform operations which are synchronized based on the first signal is outside of a region which is between, and extends to each of, the TEC and the MEMS resonator.

11. The one or more computer-readable storage media of claim 9, wherein the method further comprises synchronizing operations of a processor based on the first signal.

12. The one or more computer-readable storage media of claim 11, the method further comprising:
operating the TEC to keep the MEMS resonator at or below an average temperature of the processor.

13. The one or more computer-readable storage media of claim 9, wherein integrated circuit chips each comprise a different respective one of the TEC or the MEMS resonator.

14. A system comprising:
a packaged device comprising:
a substrate;
a microelectromechanical (MEMS) resonator over a first region of the substrate the MEMS resonator comprising a beam structure which extends over an electrode which is in or on the substrate;
an oscillator circuit coupled to the MEMS resonator;
first circuitry which is operable based on an output of the oscillator circuit, wherein the first circuitry extends over a second region of the substrate;
a sensor to communicate a sensor signal indicative of a condition of the MEMS resonator; and
a thermoelectric cooler (TEC) which overlaps the MEMS resonator, the TEC to transfer heat with the MEMS resonator based on the sensor signal, the TEC comprising:
an array of semiconductor elements, wherein the array extends horizontally across an upper side of the MEMS resonator; and
an interconnect structure at a first side of the array, the interconnect structure comprising an electrical insulator and conductive traces which extend therein, wherein the TEC is thermally coupled to receive a radiation of heat from the MEMS resonator to the interconnect structure; and
a display device coupled to the packaged device, the display device to display an image based on the clock signal.

15. The system of claim 14, wherein any circuitry which is to perform operations which are synchronized based on the output is outside of a region which is between, and extends to each of, the TEC and the MEMS resonator.

16. The system of claim 15, wherein the second circuitry is to operate the TEC to keep the MEMS resonator at or below an average temperature of a processor.

17. The system of claim 14, the packaged device further comprising the first circuitry, wherein the first circuitry comprises a processor coupled to the oscillator circuit, wherein the processor comprises circuitry to synchronize operations based on the output.

* * * * *